United States Patent [19]
Obregon et al.

[11] Patent Number: 5,287,021
[45] Date of Patent: Feb. 15, 1994

[54] LOW NOISE BICMOS CIRCUIT

[75] Inventors: Carlos D. Obregon, Phoenix; Eric D. Neely, Mesa; Michael A. Wells, Chandler, all of Ariz.

[73] Assignee: Motorola, Inc., Schaumburg, Ill.

[21] Appl. No.: 880,109

[22] Filed: May 6, 1992

[51] Int. Cl.$^5$ .................... H03K 17/60; H03K 19/02; H03K 19/20; H03K 17/16

[52] U.S. Cl. ................................ 307/570; 307/446; 307/456; 307/443

[58] Field of Search ............... 307/570, 572, 241, 446, 307/605, 603, 456, 443

[56] References Cited

U.S. PATENT DOCUMENTS

| | | | |
|---|---|---|---|
| 4,398,102 | 8/1983 | Stewart | 307/603 |
| 4,678,943 | 7/1987 | Uragami et al. | 307/473 |
| 4,839,540 | 6/1989 | Ueno et al. | 307/473 |
| 4,845,385 | 7/1989 | Ruth, Jr. | 307/570 |
| 4,845,386 | 7/1989 | Ueno | 307/570 |
| 4,904,889 | 2/1990 | Chieli | 307/570 |
| 4,975,600 | 12/1990 | Tran et al. | 307/446 |
| 4,985,645 | 1/1991 | Tsutsui | 307/570 |
| 5,023,481 | 6/1991 | Tero et al. | 307/446 |
| 5,097,150 | 5/1992 | Satou et al. | 307/570 |
| 5,128,567 | 7/1992 | Tanaka et al. | 307/605 |

OTHER PUBLICATIONS

M. Shoji, "CMOS Digital Circuit Technology", Prentice Hall, N.J., 1988, pp. 79-83.

Primary Examiner—William L. Sikes
Assistant Examiner—Trong Phan
Attorney, Agent, or Firm—Robert F. Hightower; Joe E. Barbee

[57] ABSTRACT

A plurality of transistors (22, 23, 27) are utilized to provide a low noise high-to-low transition (40) on an output (19) of a circuit (10). The transistors (22, 23, 27) are sequentially enabled to vary a rate of change of output current thereby minimizing noise created by the high-to-low transition (40). A first transistor (22) is enabled to provide a low rate of change. Subsequently, a second transistor (23) is enabled to provide a higher rate of change. Then, just prior to disabling the second transistor (23) a third transistor (27) is enabled to provide a d.c. level.

11 Claims, 2 Drawing Sheets

LOW NOISE BICMOS CIRCUIT

BACKGROUND OF THE INVENTION

The present invention relates, in general, to electrical circuits, and more particularly, to a novel low noise BICMOS circuit.

The semiconductor industry previously has produced bipolar and complementary metal oxide semiconductor (CMOS) devices on a single integrated circuit. Such combinations typically are referred to as BICMOS. Some of these prior circuits employ an output stage which provides output voltage levels that are compatible with the voltage levels of transistor-transistor logic (TTL). The output stage generally provides a rapid change of current, often referred to as high di/dt, that creates noise thereby disturbing the circuit's operation. In addition, the output stage of such circuits generally consume power even when the circuit is in a static (nonswitching) condition. Such high static power dissipation is detrimental in many applications and especially in battery powered applications.

Accordingly, it is desirable to have a circuit that provides an output voltage level that is compatible with TTL signal levels, that has low static power dissipation, that has a rapid high-to-low transition, and that minimizes noise.

SUMMARY OF THE INVENTION

Briefly stated, the present invention includes sequentially enabling a plurality of transistors to vary the rate of change of an output current of a circuit. A first transistor is enabled to provide a low rate of change. After a predetermined time, a second transistor is enabled to provide a higher rate of change. Varying the current's rate of change minimizes noise created by the circuit.

DETAILED DESCRIPTION OF THE DRAWINGS

Figure 1:
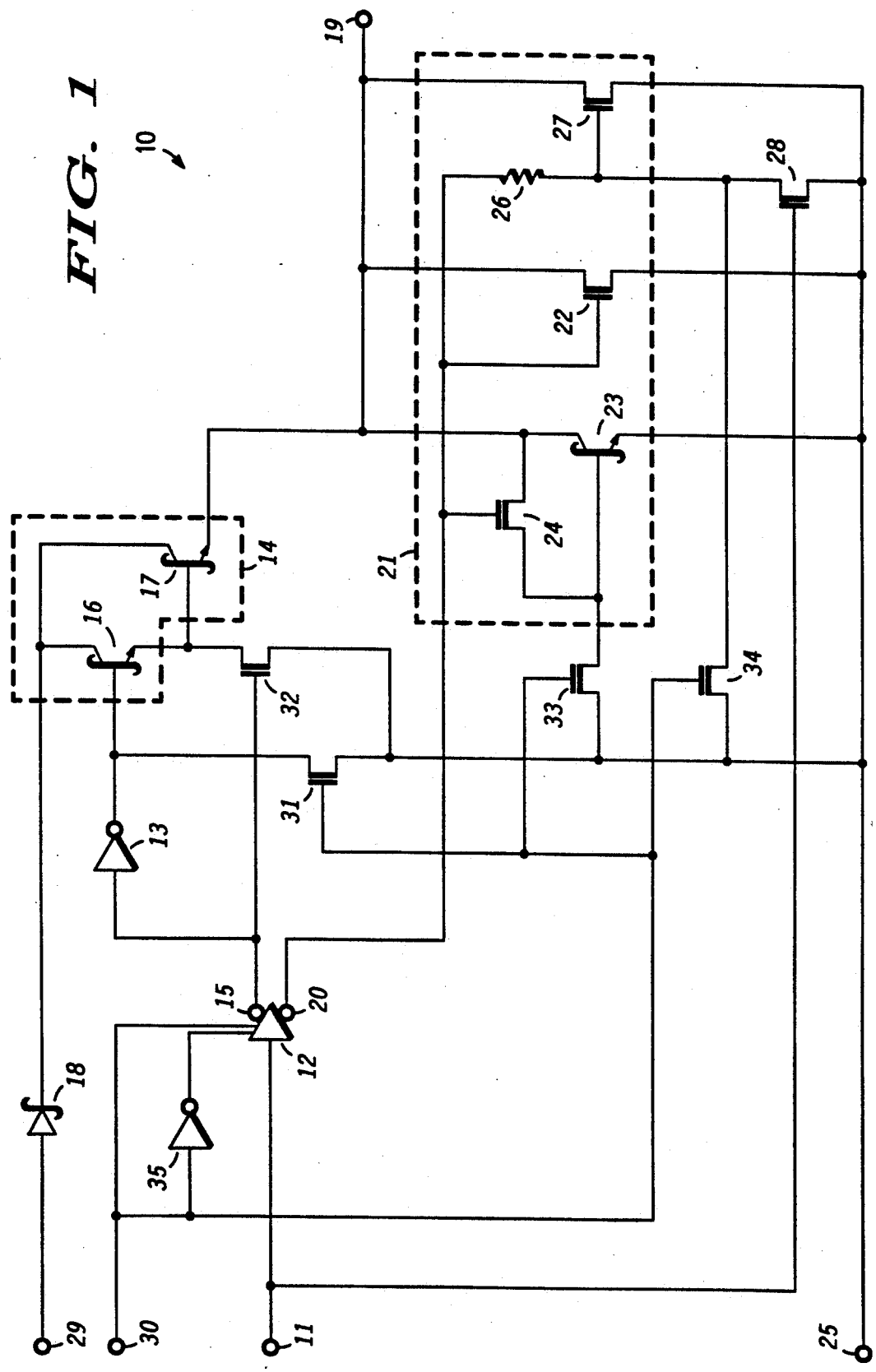
FIG. 1 schematically illustrates an embodiment of a low noise circuit in accordance with the present invention.

FIG. 1 schematically illustrates an embodiment of a low noise BICMOS circuit 10. Circuit 10 has a totem-pole output stage that includes an upper output device 14 and a lower output circuit 21. Circuit 10 also includes a signal input 11 which is connected to an input of a three-state input inverter 12. Three-state input inverter 12 has a disable and an enable input which are employed to disable inverter 12. A three-state enable input 30 of circuit 10 is connected to the enable input of inverter 12, and input 30 is also coupled to a disable input of inverter 12 by an inverter 35. Inverter 12 also has a plurality of outputs 15 and 20. When a low voltage level, hereinafter referred to as a low, is applied to input 30, inverter 12 is enabled so that signals applied to input 11 are inverted and applied to both outputs 15 and 20. When input 30 is a high voltage level, hereinafter referred to as a high, inverter 12 is in a three-state mode which places a high on output 15 and a low on output 20. It will be noted that the invented output symbols on outputs 15 and 20 only apply to data from the input of inverter 12 when input 30 is low. In the three-state mode, the power dissipation of inverter 12 is very small consequently static power dissipation is determined by process dependent leakage current. One example of such a three-state inverter is disclosed in a book by Masakazu Shoji, "CMOS Digital Circuit Technology", Prentice-Hall Inc., N.J., 1988, p. 81. Unless otherwise indicated, hereinafter the operational description of circuit 10 is predicated on having a low applied to input 30.

Output 20 is employed to control the state of lower output circuit 21. In order to maintain device 14 and circuit 21 in substantially opposite states, output 15 is connected to an input of a phasing inverter 13 and the output of inverter 13 controls the state of device 14. Device 14 can have a variety of configurations that provide a high level TTL compatible output voltage ($V_{OH}$) and output current ($I_{OH}$) to an output 19 of circuit 10.

In the preferred embodiment, device 14 includes a Schottky transistor 16 and a Schottky transistor 17 connected in a Darlington configuration. In this preferred embodiment, a base of transistor 16 is connected to the output of inverter 13 while an emitter of transistor 16 is connected to a base of transistor 17. The collectors of transistors 16 and 17 are connected together, and an emitter of transistor 17 is connected to output 19. Also in this preferred embodiment, a cathode of a Schottky diode 18 is connected to the collectors of transistors 16 and 17 while an anode is connected to a terminal of a voltage supply 29. Diode 18 prevents excessive current flow through device 14 when the voltage applied to output 19 is greater than the voltage applied to supply 29.

When output 15 is low, transistors 16 and 17 are enabled. When output 15 is high transistor 16 is disabled but transistor 17 may still be enabled. Consequently, an upper disable transistor 32 which has a gate connected output 15, a source connected to voltage return 25, and a drain connected to the base of transistor 17 is used to disable transistor 17. As will be seen hereinafter, transistor 32 is also used to disable transistor 17 when inverter 12 is in the three-state mode.

Lower output circuit 21 sequentially enables a shaping transistor 22, a current sink transistor 23, and a sustaining transistor 27 in order to provide a rapid low noise high-to-low transition on output 19. By sequentially enabling transistors 22, 23, and 27, the high-to-low transition's upper and lower edges are rounded thereby minimizing noise. Transistor 22 has a gate connected to output 20 of inverter 12, a source connected to a terminal of a voltage return 25, and a drain connected to output 19. In order to round the transition's upper edge, transistor 22 has a small width that limits the rate current flows through transistor 22. Transistor 23 is a Schottky bipolar transistor that has a collector connected to output 19, an emitter connected to voltage return 25, and a base connected to a source of an output coupler transistor 24. Transistor 24 also has a drain connected to output 19, and a gate connected to the gate of transistor 22. In order for transistor 24 to be enabled, the voltage applied to the gate of transistor 24 must exceed the threshold voltage of transistor 24 plus the base-emitter voltage ($V_{BE}$) of transistor 23. Consequently, transistor 22 is enabled before transistor 24. Sustaining transistor 27 is utilized to maintain a low on output 19 during static conditions. Transistor 27 has a source connected to voltage return 25, a drain connected to output 19, and a gate that is connected to both a first terminal of a resistor 26 and a drain of a transition transistor 28. A second terminal of resistor 26 is connected to the gate of transistor 22. Resistor 26 along with the gate capacitance of transistor 27, the drain capacitance of transistor 28, and the drain capacitance of a disable transistor 34 form an RC network that delays enabling transistor 27 until a predetermined time after transistor 22 is enabled. In order to minimize noise, the predetermined time should ensure that transistor 27 is not enabled prior to transistor 23. The delay means formed by resistor 26 can have other implementations including, but not limited to, a series of transistor delay stages or inverter delay stages, or a series of RC nodes instead of the single node in FIG. 1. In addition, the delay means could also be implemented by sensing the output voltage level and enabling transistor 27 at a predetermined output voltage value.

When outputs 15 and 20 of inverter 12 are low, device 14 is enabled and output 19 is high. When outputs 15 and 20 transition to a high, device 14 becomes disabled and a high is applied to the first terminal of resistor 26 and to the gate of transistors 22 and 24. Transistor 22 is enabled before transistor 24, as explained hereinbefore, and begins pulling output 19 low. The small size of transistor 22 limits the output current's rate of change (di/dt) at output 19 thereby minimizing the amount of noise created during the initial portion of the high-to-low transition. Transistor 22 remains enabled as long as output 20 of inverter 12 is a high level. Because of the higher voltage required to enable transistor 24, as explained hereinbefore, transistor 24 is enabled after transistor 22. Then, transistor 24 enables transistor 23 by applying the voltage on output 19 to the base of transistor 23. Once enabled, the high transconductance of transistor 23 provides a low resistance path that rapidly discharges output 19. Transistor 23 remains enabled until the voltage on output 19 reaches a predetermined voltage which is approximately the base-emitter voltage ($V_{BE}$) of transistor 23. Because of the delay means, transistor 27 is enabled at some predetermined time after transistor 22. In the preferred embodiment, transistor 27 is enabled just before transistor 23 is disabled or approximately two nanoseconds after transistor 22 is enabled. Transistors 22 and 27 remain enabled to complete the high-to-low transition and to maintain a low on output 19. Since the transconductance of transistor 27 is less than the transconductance of transistor 23, the output current's rate of change (di/dt) is lower after transistor 23 is disabled thereby rounding the lower edge of the high-to-low transition. The advantage of such a high-to-low transition is further illustrated in FIG. 2. Sequentially enabling transistors 22, 23, and 27 provides a rapid high-to-low transition that has lower noise than prior circuits. In addition, since transistor 23 is only active during the transition, static power dissipation of circuit 10 is reduced over prior circuits.

Further, transistor 22 provides temperature compensation for transistor 23. At elevated temperatures, the transconductance of transistor 22 decreases but the transconductance of transistor 23 increases. Therefore, the rate of current change during the time both transistors 22 and 23 are enabled remains substantially constant over temperature.

A transistor 28 is employed to rapidly disable transistor 27 when a high is applied to input 11. A gate of transistor 28 is connected directly to input 11 thereby bypassing internal delay stages of circuit 10 so that transistor 28 can rapidly disable transistor 27. Also, a source of transistor 28 is connected to return 25 to facilitate disabling transistor 27.

A disable circuit includes a plurality of disable transistors 31, 33, and 34 to ensure that device 14 and circuit 21 are disabled when input 30 is high. Each of transistors 31, 33, and 34 have a gate connected to input 30, while a source of each transistor is connected to return 25. A drain of transistor 31 is connected to the base of transistor 16 to ensure that transistor 16 is disabled when enable input 30 is high. Similarly, a drain of transistors 33 and 34 is connected to the base of transistor 23 and the gate of transistor 27 respectively to ensure that lower output circuit 21 is disabled. As discussed hereinbefore, when enable 30 is high inverter 12 is in a three-state mode that applies a high to output 15. Consequently, transistor 32 is enabled thereby disabling transistor 17. Disabling transistors 16, 17, 23, and 27 during the three-state mode further reduces static power dissipation of circuit 10.

Figure 2:
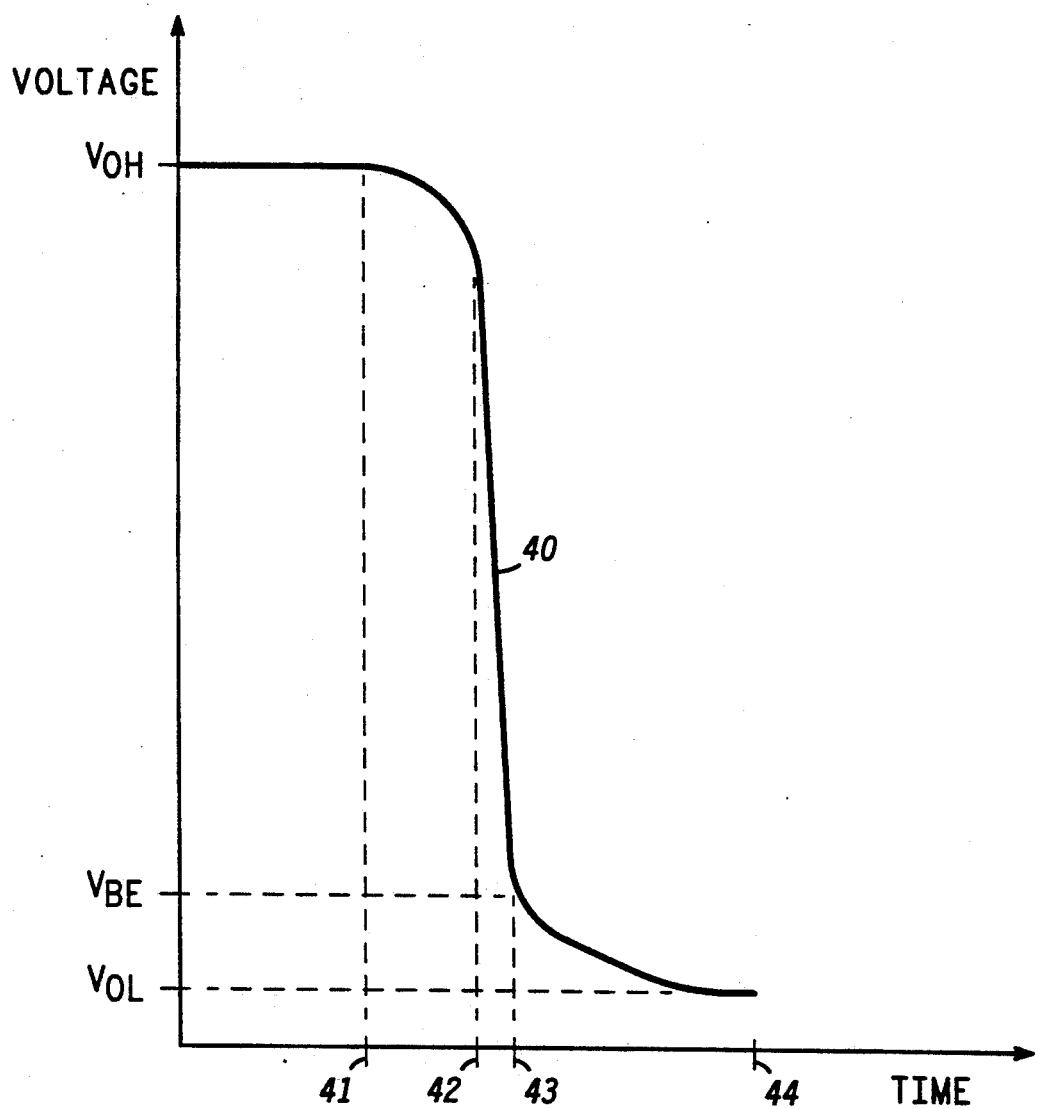
FIG. 2 is a graph illustrating a high-to-low transition produced by the circuit of FIG. 1 in accordance with the present invention.

FIG. 2 is a graph illustrating the effect of sequentially enabling transistors 22, 23, and 27 of FIG. 1. The abscissa of FIG. 2 represents time while the ordinate represents the voltage on output 19 of FIG. 1. For clarity, the explanation of FIG. 2 contains references to the elements of FIG. 1. Consequently, references to numbers less than reference number 40 in the following discussion refer to FIG. 1. A plot 40 illustrates a high-to-low transition on output 19 in response to a low-to-high transition on outputs 15 and 20 of inverter 12. At time 41, transistor 22 of FIG. 1 is enabled and begins pulling the output voltage down from the high voltage level ($V_{OH}$). The small current flow through transistor 22 limits the rate at which the voltage changes as illustrated between points 41 and 42. At point 42, transistor 23 is enabled and rapidly changes the output voltage. At the predetermined time after transistor 22 is enabled, transistor 27 is enabled. In the preferred embodiment, this occurs just before time 43. Transistor 23 remains enabled until the output voltage becomes insufficient ($V_{BE}$) to enable transistor 23 at point 43. Transistors 22 and 27 remain enabled to complete the high-to-low transition. After transistor 23 is disabled, the high to low transition rate slows thereby producing a smooth transition between points 43 and 44 to the eventual low level ($V_{OL}$). Therefore, plot 40 illustrates that sequentially enabling transistors 22, 23, and 27 produces smooth edges, as shown between points 41-42 and between points 43-44, that reduce noise created by a high-to-low transition on output 19.

By now it should be appreciated that there has been provided a novel low noise TTL compatible circuit having low static power dissipation that is determined only by process dependent leakage current. The circuit sequentially enables three transistors of a lower output circuit in order to minimize noise during a high-to-low transition. A small transistor is enabled first to limit the output current's rate of change during the transition's initial portion. A bipolar transistor is subsequently enabled during a portion of the transition in order to increase the current's rate of change, followed by enabling a final transistor. The bipolar transistor is disabled before the transition is complete. The final transistor provides a rate of current change that is slower than that of the bipolar transistor, thus, minimizing noise created after the bipolar transistor is disabled. Since the bipolar transistor is only enabled during a portion of the transition, static power dissipation is minimized.

We claim:
1. A low noise BICMOS circuit comprising:
a three-state input inverter having an input coupled to an input of the BICMOS circuit, a first output and a second output;
a phasing inverter having an input coupled to the first output of the three-state input inverter, and an output;
a first transistor having a control electrode coupled to the output of the phasing inverter, a first current electrode, and a second current electrode;
a second transistor having a control electrode coupled to the second current electrode of the first transistor, a first current electrode coupled to the first current electrode of the first transistor, and a second current electrode coupled to an output of the BICMOS circuit;
an output coupler transistor having a control electrode coupled to the second output of the three-state input inverter, a first current electrode coupled to the output of the BICMOS circuit, and a second current electrode;
a current sink transistor having a control electrode coupled to the second current electrode of the output coupler transistor, a first current electrode coupled to the output of the BICMOS circuit, and a second current electrode coupled to a voltage return;
a shaping transistor having a control electrode coupled to the control electrode of the output coupler transistor, a first current electrode coupled to the output of the BICMOS circuit, and a second current electrode coupled to the voltage return;
a resistor having a first terminal coupled to the control electrode of the shaping transistor, and a second terminal;
a transition transistor having a control electrode coupled to the input of the BICMOS circuit, a first current electrode coupled to the second terminal of the resistor, and a second current electrode coupled to the voltage return; and
a sustaining transistor having a control electrode coupled to the second terminal of the resistor, a first current electrode coupled to the output of the BICMOS circuit, and a second current electrode coupled to the voltage return.

2. The BICMOS circuit of claim 1 further including a protection diode having an anode coupled to a voltage supply, and a cathode coupled to the first current electrode of the first transistor.

3. The BICMOS circuit of claim 1 further including a disable circuit comprising:
a first disable transistor having a control electrode coupled to an enable input of the BICMOS circuit, a first current electrode coupled to the control electrode of the first transistor, and a second current electrode coupled to the voltage return;
a second disable transistor having a control electrode coupled to the enable input of the BICMOS circuit, a first current electrode coupled to the control electrode of the current sink transistor, and a second current electrode coupled to the voltage return; and
a third disable transistor having a control electrode coupled to the enable input of the BICMOS circuit, a first current electrode coupled to the control electrode of the sustaining transistor, and a second current electrode coupled to the voltage return.

4. The BICMOS circuit of claim 1 further including the three-state input inverter having a disable input coupled to an enable input of the BICMOS circuit by an inverter, and an enable input coupled to the enable input of the BICMOS circuit.

5. The BICMOS circuit of claim 1 wherein the shaping transistor has a transconductance that is smaller than a transconductance of the current sink transistor.

6. The BICMOS circuit of claim 1 further including an upper disable transistor having a control electrode coupled to the first output of the three-state input inverter, a first current electrode coupled to the control electrode of the second transistor, and a second current electrode coupled to the voltage return.

7. A TTL compatible output circuit comprising:
a first transistor having a first current electrode coupled to an output of the circuit, a second current electrode coupled to a voltage return, and a control electrode;
a second transistor having a first current electrode coupled to the output of the circuit, a second current electrode coupled to a voltage return, and a control electrode,
a second transistor having a first current electrode coupled to the output of the circuit, a second current electrode coupled to the voltage return, and a control electrode; and
a delay means for enabling the second transistor a predetermined time after enabling the first transistor, the delay means having a first terminal coupled to the control electrode of the first transistor, and a second terminal coupled to the control electrode of the second transistor;
a third transistor having a first current electrode coupled to the output of the circuit, a control electrode coupled to the control electrode of the first transistor, and a second current electrode; and
a fourth transistor having a first current electrode coupled to the first current electrode of the third transistor, a second current electrode coupled to the voltage return, and a control electrode coupled to the second current electrode of the third transistor wherein the fourth transistor is only enabled during a high to low transition of a voltage on the output of the circuit.

8. The circuit of claim 7, wherein the delay means includes a resistor having a first terminal coupled to the control electrode of the first transistor and a second terminal coupled to the control electrode of the second transistor.

9. The circuit of claim 7 further including
a fifth transistor having a control electrode coupled to an input of the circuit, a first current electrode coupled to the control electrode of the second transistor, and a second current electrode coupled to the voltage return.

10. The circuit of claim 7 wherein the first transistor has a transconductance that is smaller than a transconductance of the fifth transistor.

11. The circuit of claim 7 further including an inverter having an input coupled to an input of the TTL compatible output circuit, and an output; a fifth transistor having a control electrode coupled to the output of the inverter, a first current electrode, and a second current electrode; and a sixth transistor having a control electrode coupled to the second current electrode of the fifth transistor, a first current electrode coupled to the first current electrode of the fifth transistor, and a second curent electrode coupled to the output of the circuit wherein the fifth transistor and the sixth transistor operate as a darlington transistor.

* * * * *

UNITED STATES PATENT AND TRADEMARK OFFICE
CERTIFICATE OF CORRECTION

PATENT NO. : 5,287,021

DATED : February 15, 1994

INVENTOR(S) : Obregon et al.

It is certified that error appears in the above-indentified patent and that said Letters Patent is hereby corrected as shown below:

Column 6, claim 7, lines 18, 19, 20 & 21, delete "a second transistor having a first current electrode coupled to the output of the circuit, a second current electrode coupled to a voltage return, and a control electrode,".

Signed and Sealed this

Seventh Day of February, 1995

Attest:

BRUCE LEHMAN

Attesting Officer

Commissioner of Patents and Trademarks